United States Patent [19]

Reisman

[11] Patent Number: 4,576,884

[45] Date of Patent: Mar. 18, 1986

[54] METHOD AND APPARATUS FOR EXPOSING PHOTORESIST BY USING AN ELECTRON BEAM AND CONTROLLING ITS VOLTAGE AND CHARGE

[75] Inventor: Arnold Reisman, Raleigh, N.C.

[73] Assignee: Microelectronics Center of North Carolina, Research Triangle Park, N.C.

[21] Appl. No.: 620,510

[22] Filed: Jun. 14, 1984

[51] Int. Cl.[4] .......................... G03C 5/00; G21K 5/04
[52] U.S. Cl. ...................... 430/30; 430/296; 430/311; 430/942; 250/492.2
[58] Field of Search ............... 430/30, 296, 942, 311; 356/357; 250/310, 492.2

[56] References Cited

U.S. PATENT DOCUMENTS

| | | | |
|---|---|---|---|
| 3,258,898 | 7/1966 | Garibotti | 29/155.5 |
| 3,507,709 | 4/1970 | Bower | 148/1.5 |
| 3,536,547 | 10/1970 | Schmidt | 156/17 |
| 3,539,401 | 11/1970 | Yamashita | 148/1.5 |
| 3,607,382 | 10/1967 | Henker | 117/212 |
| 3,737,347 | 6/1973 | Alcott et al. | 148/17.5 |
| 3,875,416 | 4/1975 | Spicer | 250/492 |
| 3,914,857 | 10/1975 | Goser et al. | 29/579 |
| 3,950,187 | 4/1976 | Kirkpatrick | 148/1.5 |
| 4,082,958 | 4/1978 | Kirkpatrick | 250/492 |
| 4,086,694 | 5/1978 | U | 29/579 |
| 4,151,417 | 4/1979 | Takigawa | 250/396 R |
| 4,232,439 | 11/1980 | Shibata | 29/579 |
| 4,302,530 | 11/1981 | Zemel | 430/311 |
| 4,308,586 | 12/1981 | Coates | 364/525 |
| 4,348,804 | 9/1982 | Ogawa et al. | 29/580 |
| 4,350,866 | 9/1982 | Zasio et al. | 219/121 EM |
| 4,383,026 | 5/1983 | Hall | 430/325 |
| 4,500,615 | 2/1985 | Iwai | 430/30 |

OTHER PUBLICATIONS

"On the Removal of Insulator Process Induced Radiation Damage from Insulated Gate Field Effect Transistors at Elevated Pressure,"-A. Reisman, J. M. Aitken, A. K. Ray, M. Berkenblit, C. J. Merz, and R. P. Havreluk, Reprinted from *Journal of the Electrochemical Society*, vol. 128, No. 7, 7/1981.

"The Effects of Pressure, Temperature, and Time on the Annealing of Ionizing Radiation Induced Insulator Damage in N-Channel IGFET's"-A. Reisman and C. J. Merz, Reprinted from *Journal of the Electrochemical Society*, vol. 130, No. 6, Jun. 1983.

"Low Energy X-Ray and Electron Damage to IGFET Gate Insulators"-A. Reisman and C. J. Merz.

*Primary Examiner*—John E. Kittle
*Assistant Examiner*—José G. Dees
*Attorney, Agent, or Firm*—Bell, Seltzer, Park & Gibson

[57] ABSTRACT

A method and apparatus are disclosed for exposing photoresist using an incident electron beam during the fabrication of a semiconductor device. The method includes the steps of coating the substrate with a photoresist that is exposed in response to an electron beam. An electron beam is projected onto the photoresist and deflected to trace a pattern. The voltage and the amount of charge of the electron beam are controlled as it is deflected so that the energy incident upon the coated photoresist is correlated to variations in the photoresist thickness to expose the photoresist with minimal penetration therethrough to underlying structures.

3 Claims, 10 Drawing Figures

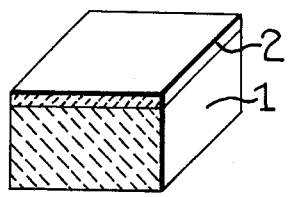
_Fig-1A_
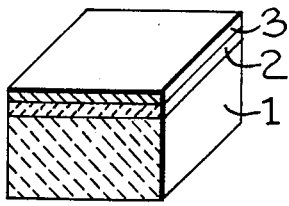
_Fig-1B_
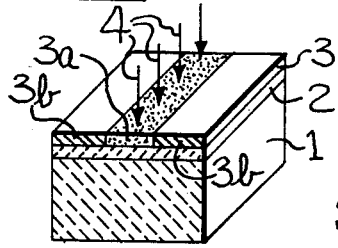
_Fig-1C_
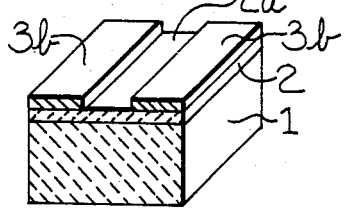
_Fig-1D_
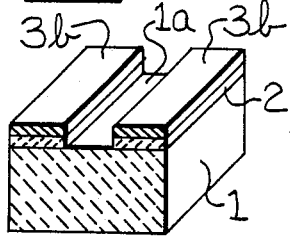
_Fig-1E_
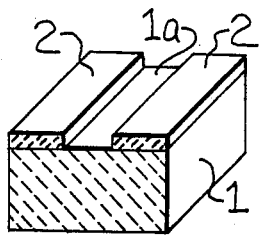
_Fig-1F_
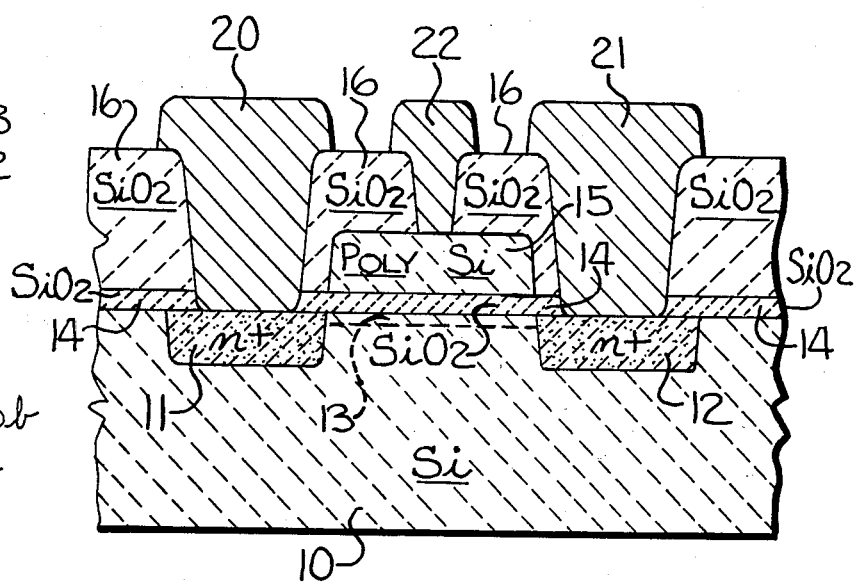
_Fig-2_

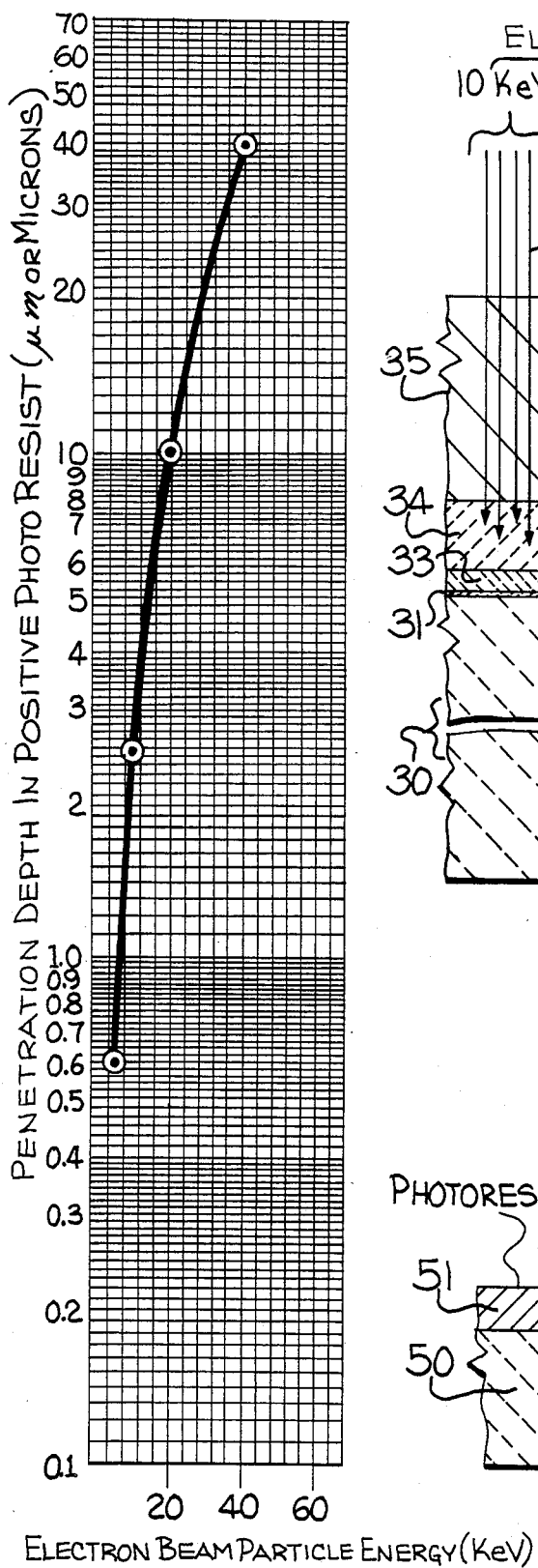
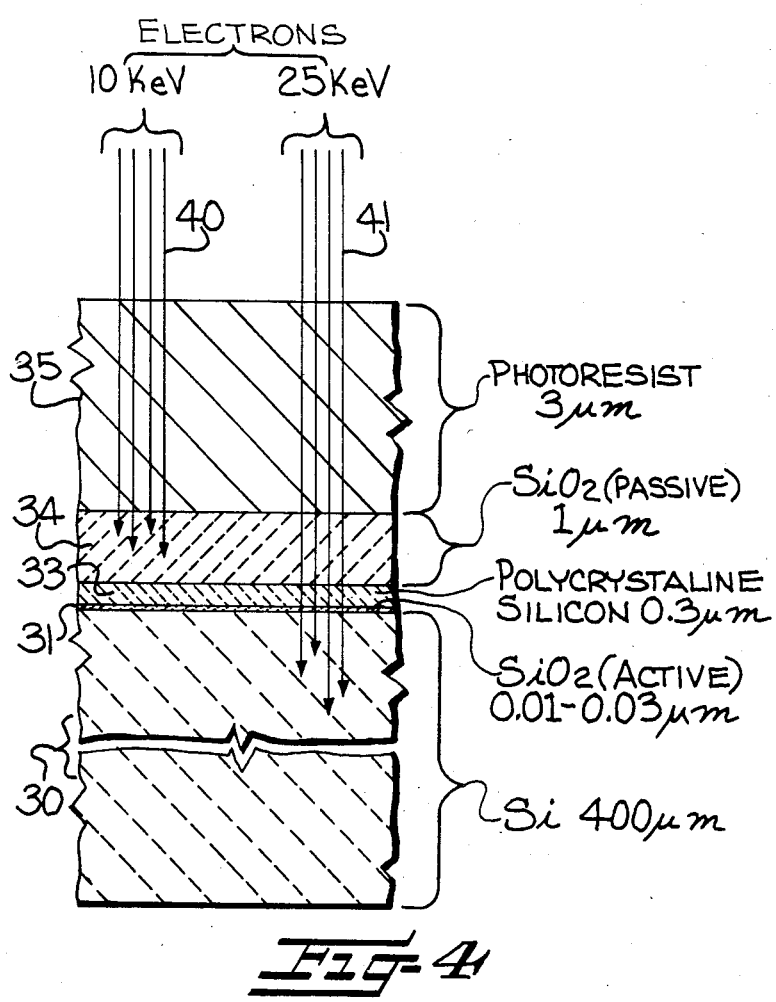
Fig-4
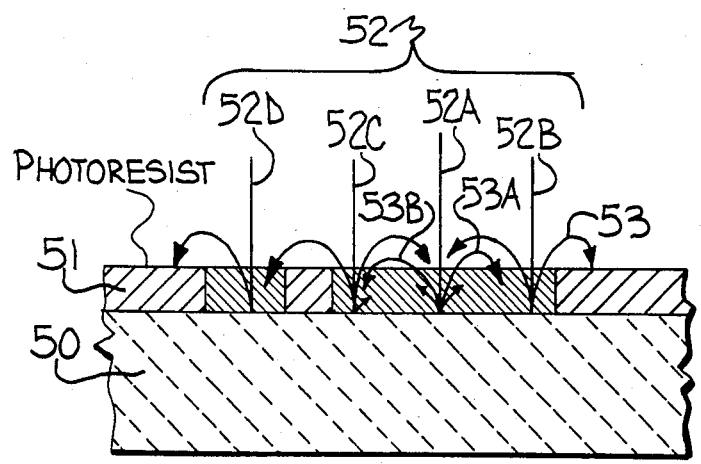
Fig-3
Fig-5

METHOD AND APPARATUS FOR EXPOSING PHOTORESIST BY USING AN ELECTRON BEAM AND CONTROLLING ITS VOLTAGE AND CHARGE

FIELD OF THE INVENTION

This invention relates to the fabrication of semiconductor devices using electron beam aided processes, such as the use of an electron beam to trace an exposure pattern in the photoresist or other film coated onto an underlying semiconductor or composite substrate. More specifically, the invention relates to a method of exposing the photoresist coating with an electron beam where the accelerating voltage and the amount of charge of the projected electron beam are controlled and correlated to thickness variations in the photoresist, as may result from variations in the underlying topography. Thus, the energy of the electron beam incident upon the photoresist and underlying structures or layers is controlled as the beam is deflected. This permits thorough exposure of the photoresist by the electron beam while minimizing ionizing radiation damage to the underlying semiconductor material, structures, insulating layers, and the like.

BACKGROUND OF THE INVENTION

As an aid to understanding the problems in prior art methods and apparatus, reference should be made to FIGS. 1A–1F which illustrate a typical series of steps used in electron beam, photo aided, or lithographic processes to manufacture semiconductor devices. Referring to FIG. 1A, a semiconductor substrate 1, such as a slice or wafer of silicon or other composite has grown thereon an insulating oxide layer 2, such as silicon dioxide. A series of steps is undertaken to cut a window or pattern in the silicon dioxide layer and expose a predetermined area of the underlying substrate 1. Referring to FIG. 1B and using like reference numerals for like items, a film of photoresist 3 is coated onto the entire surface of the oxide layer 2. Like photographic film, the photoresist is sensitive to incident radiation, such as an electron beam, visible light, ultraviolet light, or X-rays.

Referring to FIG. 1C, a traveling electron beam 4 is moved across the photoresist to expose selected portions. The beam is directed in a manner to expose the photoresist according to a pattern traced or "written" by the beam. This is referred to as maskless or direct processing, and it delineates an exposure pattern by writing directly on the photoresist. Since the electron beam has a shorter wavelength and greater depth of field than many other types of radiation, it is capable of forming very fine exposure patterns, and it eliminates the need to create a cumbersome physical mask, as used with ultraviolet processing, which is time consuming and very costly. In FIG. 1C the exposed portion is indicated by the stippled area 3a. That portion of the photoresist labeled 3b is not exposed to the incident radiation and is not affected thereby.

Referring to FIG. 1D, the photoresist is subjected to a process that dissolves and removes the exposed photoresist 3a but does not affect the unexposed photoresist. This leaves a pair of spaced parallel strips 3b of unexposed photoresist separated by a channel 2a of the underlying oxide layer 2. Referring to FIG. 1E, the unexposed photoresist 3b and the oxide layer 2a are treated so as to remove the unprotected oxide, but not the unexposed photoresist 3b, in order to expose a channel 1a of the underlying material 1. Referring to FIG. 1F, the unexposed photoresist 3b has been stripped from the oxide layer in preparation for succeeding process steps, leaving a channel of bare silicon defined by strips of superposed silicon dioxide 2.

The desire to increase circuit density on semiconductor material and recent developments in photo aided processes have resulted in the ability to create smaller and smaller circuit elements. Typically, these elements are on the order of a few microns in size or smaller, and they may be composed of layers on the order of only 0.01 microns deep. Thus, it is increasingly important that succeeding processing steps do not disturb the effects of earlier steps, and, for this reason, it is desirable to control the energy of the electron beam or other radiation used to expose the photoresist.

In the past the energy of the incident electron beam was not controlled to match the amount of energy required to expose the photoresist or the thickness or depth of the photoresist at a given location. Instead, the electron beam voltage and charge was fixed at a level high enough to expose the thickest portions of the photoresist layer without regard to any problems that might arise where the photoresist was thinner, or where there were other variations in the photoresist coating, or where the underlying structures were "tall," or where the underlying layers were susceptible to damage from the incident electron beam radiation. Some attempts have been made to ameliorate scattering of the electron beam by varying total incident dosages, but this was done at a constant accelerating voltage and without regard to variations in the photoresist thickness. As a result, the electron beam had excess energy in some sectors and the electrons penetrated to the underlying layers or substrate, resulting in unwanted damage. For example, unwanted damage was inflicted upon insulated gate field effect transistors (IGFET) when the accelerating voltage of the electron beam used to expose the photoresist was too high and the electrons penetrated through the photoresist and overlying films to the gate insulator. Experiments have demonstrated that it is desirable to limit the energy density in the underlying layers to less than $10^5$ or $10^6$ Rads $SiO_2$.

To achieve exposure of the photoresist in a typical electron beam system, the electrons are accelerated to 20 to 25 kilovolts (KeV), or even as high as 50 KeV, and the photoresist is subjected to dosages of 20 to 30 microcoulombs per square centimeter. At such levels of dosage and at these accelerating voltages, the incident electrons pass through typical thicknesses of photoresist, i.e. two to three microns, and damage the underlying films and semiconductor materials. This produces fixed positive charge and neutral traps, which are undesirable. Prior to the application of a metalizing layer, it was believed that such damage could be annealed by heating the semiconductor wafers in a hydrogen-containing ambient atmosphere in the 550°–700° C. range. However, it has recently been claimed that following repetitive, high energy radiation damage to the gate insulator of a MOS capacitor, even vigorous annealing treatments do not correct the damage done. See A. Reisman et al., "The Effects of Pressure, Temperature and Time on the Annealing of Ionizing Radiation Induced Insulator Damage in N-channel IGFET's," *Journal of the Electrochemical Society*, Vol. 130 No. 6, June 1983; and A. Reisman et al, "On the Removal of Insulator Process Induced Radiation Damage from Insulated Gate Field Effect Transistors at Elevated Pressure," *Journal of the Electrochemical Society*, Vol. 128, No. 7, July 1981. Moreover, excessive exposure to high temperatures may alter doping levels or configurations, or unduly stress the lattice structure. Accordingly, there is a great need to minimize the damage caused by the use of high energy electrons and other ionizing radiation during the manufacture and processing of semiconductors.

The present invention is based upon the recognition that proper exposure of the photoresist is a function of the energy absorbed by it rather than the accelerating voltage of the electron beam or the amount of charge carried by the beam alone. Stated otherwise, the extent of radiation damage is a function of the total energy absorbed in a given mass of material and not the energy per photon or energy per electron. Thus, the present invention involves matching the energy of the incident electron beam and electron dose to the amount of energy locally required to thoroughly expose the photoresist. This is done by controlling the voltage and the amount of charge of the incident electron beam to correlate to variations in the photoresist thickness. By controlling the voltage, the electron beam will penetrate a predetermined distance with minimal penetration to underlying structures, and by controlling the amount of charge carried by the electron beam, the energy of the electron beam is controlled to thoroughly expose the photoresist.

The present invention also has applications in compensating for proximity effects encountered in electron beam processes, and for accommodating topographical variations resulting from the layered construction of the semiconductor.

Thus, it is an object of the present invention to provide a method and apparatus for exposing photoresist with an electron beam during the fabrication of semiconductor devices by controlling the voltage and the amount of charge of the electron beam to minimize ionizing radiation damage to the underlying films and semiconductor substrate.

It is a further object of the present invention to provide a method and apparatus for exposing photoresist with an electron beam during the fabrication of semiconductor devices by controlling the voltage of the electron beam to substantially penetrate the entire depth of the photoresist thickness with minimal penetration therethrough to the underlying structures.

It is a still further object of the present invention to provide a method and apparatus for exposing photoresist with an electron beam during the fabrication of semiconductor devices by controlling the voltage and the amount of charge of the projected electron beam as it is deflected to match the total energy of the electron beam to the amount of energy absorbed by the photoresist during exposure from an incident electron beam.

Accordingly, the present invention is a method and apparatus for exposing photoresist with an electron beam during the fabrication of a semiconductor device. The method includes coating a substrate with a photoresist. An electron beam is projected onto the photoresist and deflected to expose the photoresist in a predetermined pattern. The voltage and the amount of charge of the electron beam are controlled as the beam is deflected so that the energy incident upon the photoresist from the electron beam is correlated to variations in the photoresist thickness to expose the photoresist with no significant penetration therethrough to the underlying structures.

DESCRIPTION OF THE DRAWINGS

FIGS. 1A–1F illustrate a typical series of steps used in electron beam processes to manufacture semiconductor devices.

FIG. 2 is a schematic cross-sectional view of an insulated gate field effect transistor.

FIG. 3 is a graph of the electron beam particle energy in KeV versus the penetration depth in positive photoresist in microns, according to the Terrill equation.

FIG. 4 is a schematic cross-sectional view of a semiconductor in the process of being manufactured illustrating the penetration of incident electrons of different accelerating voltages during the exposure of a photoresist coating.

FIG. 5 is a schematic cross-sectional view of a photoresist layer on an underlying substrate being subjected to an incident electron beam, and illustrating the scattering of some of the electrons.

DESCRIPTION OF THE INVENTION

Referring to FIG. 2, which is not drawn to scale, a cross-sectional schematic view of an n-channel enhancement mode insulated gate field effect transistor is illustrated. It comprises a substrate 10 of p-material, and a source 11 and drain 12 of n+-material separated by an n-channel 13. An electrically insulating layer of silicon dioxide 14 bridges the source and drain and overlies the channel 13. This insulating layer is used as a gate dielectric to separate the gate electrode 15, which is a layer of polycrystaline silicon, from the n-channel 13, and its thickness is usually much less than the nearby silicon dioxide layers 16 used for masking, device isolation, or surface passivation. Metalized contacts 20, 21 and 22 make electrical connections with the source 11, drain 12, and gate electrode 15, respectively. In such an enhancement mode IGFET, there is no conductive channel between the source 11 and drain 12 at zero gate voltage, as measured between the source and gate. As a positive gate bias is applied and increased beyond a threshold value, a localized inversion layer is formed in the n-channel 13 immediately underneath the gate dielectric 14 and it serves as a conducting channel between the source and drain. The conductivity of the induced channel is proportional to the applied gate bias, but it is degraded by fixed positive charge and neutral traps, which are introduced by excessive ionizing radiation, i.e. electron beams of excessive energy.

During the course of manufacturing a semiconductor device, such as the IGFET illustrated in FIG. 2, it is necessary to go through numerous cycles of the electron beam processes described in connection with FIGS. 1A–1F. To determine the depth to which an electron will penetrate the photoresist, reference is made to the Terrill equation:

$$X_e = \frac{2.5 \times 10^{-12} V^2}{d}$$

which determines the maximum penetration depth $X_e$ for electrons with accelerating potentials in the range $10^3$ to $10^5$ volts. For the calculations V is in volts, d is the density in grams per cubic centimeter (g/cm$^3$), and $X_e$ is in centimeters (cm). For the graph of FIG. 3, d for photoresist was assumed to be 2.00 g/cm$^3$. The information in the following table is from the chart is FIG. 3.

| Electron Beam Particle Energy (KeV) | Penetration (microns) (approximately) |
|---|---|
| 4 | 0.5 |
| 8 | 2 |
| 12 | 4 |
| 16 | 6.5 |
| 20 | 10 |
| 24 | 15 |
| 28 | 20 |

Thus, for example, if the photoresist at a particular location is 2 microns deep, the incident electron beam must have a particle energy of about 8 KeV to penetrate therethrough. Similarly, if the electron beam has an energy of 24 KeV, it will penetrate well through the 2 micron deep photoresist to the underlying structures.

Referring to FIG. 4, which is not drawn to scale, a schematic cross-sectional view of a semiconductor in the process of undergoing photolithography is illustrated. It is typical of a portion of an IGFET, but it is to be understood that the invention is not limited to IGFET's and may be used for other devices and in connection with other electron beam processing techniques. The device in FIG. 4 comprises a substrate 30 of semiconductor material, such as silicon or a composite material. This substrate is typically on the order of 400 microns thick. A thin layer of silicon dioxide (SiO$_2$) 31 overlies the substrate and it is approximately 0.01 to 0.05 microns thick. It is an active layer and is used as a dielectric between the underlying substrate 30 and the overlying layer of polycrystaline silicon 33. The polycrystaline silicon layer is approximately 0.3 microns thick and acts as a gate electrode. A thicker layer of silicon dioxide 34 overlies the polycrystaline silicon. It is approximately one micron thick and is used for masking, device isolation, surface passivation, or the like.

A layer of photoresist 35 overlies the silicon dioxide layer 34 and is approximately three microns thick. Alternately, the photoresist may be of multiple layers. A bottom planarizing layer having portions that are two to three microns thick is used to overlay the topographical features of the underlying substrate being fabricated, such as the surface contours apparent in FIG. 2. A top imaging layer having a relatively uniform thickness of about 0.5 micron overlies the planarizing layer and is exposed in appropriate places by an electron beam to generate a photoresist mask. The local thickness of the photoresist coating may be determined based upon the known topography of the underlying substrate, as is evident from FIG. 2. Although not common, other variations may occur in the photoresist coating, e.g. density, depending upon the particular techniques or coating used, and these variations may be noted as necessary or desirable for use in correlating the accelerating voltage and amount of charge of the incident electron beam.

The coated photoresist 30 is subjected to an incident electron beam or other ionizing radiation that is directed to trace a pattern on the photoresist and thereby expose it. The equipment and techniques for this exposure are well known, as are the techniques for controlling the deflection of the electron beam, its accelerating voltage, and the amount of charge of the incident electron beam, as it is deflected.

FIG. 4 also illustrates the penetration of a 10 KeV incident electron beam 40 as compared to the penetration of a 25 KeV incident electron beam 41. The 10 KeV electron beam is illustrated as penetrating substantially the entire depth of the photoresist 20, but no more; the 25 the 25 KeV electron beam is illustrated as penetrating the photoresist 35, the passive silicon dioxide layer 34, the polycrystaline silicon layer 33, the active silicon dioxide layer 31, and into the underlying substrate 30. The differences between these two accelerating voltages and the resultant effects are best illustrated by the following hypothetical example.

For instance, if three microns of photoresist require that the incident electron beam have 10 KeV of accelerating voltage to penetrate therethrough, a higher accelerating voltage, e.g. 25 KeV, will cause many of the electrons to pass through the photoresist to the underlying films, and this will inflict unwanted damage thereon.

The relative degree of penetration of the electrons in terms of the energy absorbed in the three microns of photoresist may be quantified empirically as being roughly proportional to the ratio of the 16th power of the accelerating voltages. Assuming that a 10 KeV electron beam will fully expose photoresist that is three microns deep, a 25 KeV electron beam will penetrate approximately thirteen microns of photoresist, or four times as deep as the 10 KeV electron beam (based on FIG. 3). Therefore only (3/13) or 23 percent of the energy carried by the electrons is absorbed in the photoresist. The remaining 77 percent of the energy associated with the deeper penetrating electrons is wasted or dissipated in the underlying structures as illustrated in FIG. 3B, and this may result in undesirable damage.

Since proper exposure of the photoresist is a function of the energy absorbed by it rather than the accelerating voltage alone or the amount of charge carried by the electron beam alone, the amount of charge is also controlled so that the total energy of the electron beam (volts×charge) matches the energy that is absorbed by the photoresist for thorough exposure as the beam is deflected to trace a pattern on the photoresist. The amount of energy so absorbed may be readily determined and depends, in part, upon the density and thickness of the photoresist. Returning to our example, a 10 KeV electron beam with a dosage of 20 microcoulombs per cubic centimeter will impart $2 \times 10^6$ ergs per cubic centimeter for the three micron thickness of photoresist. If one uses a 20 microcoulomb per cubic centimeter dosage with a 25 KeV electron beam, the total energy is $5 \times 10^6$ ergs per cubic centimeter. However, since only 23 percent of the incident electrons are absorbed in the three micron thickness of photoresist, the total energy absorbed is only $(0.23) (5 \times 10^6) = 1.15 \times 10^6$ ergs. The remaining $3.85 \times 10^6$ ergs of energy is dissipated in the underlying substrate where it may generate the unwanted defects discussed earlier, such as fixed positive charges and neutral traps. The fixed positive charges alter the threshold voltage of an IGFET, and if electrons become trapped in them or neutral traps during usage, the long term stability of the device will be impaired.

Accordingly, in the present invention the accelerating voltage of the electron beam is controlled and correlated to thickness variations in the photoresist as the electron beam traces a pattern so that the beam thoroughly penetrates the coated photoresist and dissipates substantially all of its energy therein, without significant penetration therethrough that might damage the underlying structure, particularly the gate and field insulators. And, by controlling the amount of charge of the projected electron beam so that the electron beam energy matches the amount of energy necessary to expose the photoresist, the electron beam thoroughly exposes the coated photoresist with no significant ionizing radiation damage to the underlying substrate. In the past, to insure that the photoresist had been thoroughly exposed, the accelerating voltage was usually increased without regard to excessive penetration of the underlying substrate or energy dissipation therein.

From an application's standpoint the invention may be used to compensate for proximity effects, and to compensate for topographical variations resulting from the layered construction of the semiconductor. And, by appropriately controlling the voltage and the amount of charge of the projected electron beam to correlate the energy to variations in the photoresist thickness, the overall efficiency of the process is improved because a higher percentage of the energy of the electron beam is absorbed in the photoresist rather than being wasted in the underlying layers.

Referring to FIG. 5, a substrate 50 is coated with a layer of photoresist 51. An electron beam 52 is deflected across the surface of the photoresist to trace the desired patterns, such as two adjacent strips. However, some electrons are reflected out of the target area, as illustrated by reference numeral 53. For those electrons near the center of the target area, such as those comprising beam 52A, any reflected electrons are usually reabsorbed in the target area at adjacent locations, as illustrated by reflected beams 53A, 53B. It is those beams adjacent the perimeter of the target area, such as beams 52B, 52C, 52D for which the full energy potential is not realized due to the escape of certain electrons from the target area. In the past, this problem was corrected by either increasing the dwell time at a constant beam current and beam voltage near the perimeter, or rewriting or overwriting areas already covered by the beam. This is time consuming and costly. Using the teachings of the present invention, the electron beam voltage is tailored to the energy to be absorbed on a given layer thickness to minimize reflection and thereby optimize the electron energy absorption process. This improves efficiency and reduces the undesirable horizontal scattering of the electrons and any associated damage.

Similarly, to the extent that there are topographical variations in the underlying structures, as may be seen from FIG. 2, they will result in varying thicknesses of the photoresist as the electron beam is deflected from one point to another. By controlling the voltage and the amount of charge in accordance with the variations in photoresist thickness, the photoresist is exposed with minimal penetration therethrough to the underlying structures.

In the drawings and specification there has been set forth an exemplary embodiment of the invention. It should be understood that while specific terms are employed, they are used in a generic and descriptive sense only and not for purposes of limitation.

That which is claimed is:

1. A method for exposing photoresist with an electron beam during the fabrication of a semiconductor device, said method comprising the steps of:
   coating a substrate to an approximate predetermined thickness with a photoresist that is exposed in response to an incident electron beam;
   locating any variations in the thickness of the coated photoresist in the area upon which the electron beam is incident;
   projecting an electron beam onto the coated photoresist and deflecting the electron beam to trace a pattern on the photoresist; and
   controlling the energy of the projected electron beam by controlling the acceleration voltage of the projected electron beam as it is deflected to correlate the acceleration voltage to local variations in the thickness of the coated photoresist to match the penetration depth of the electron beam into the photoresist to the thickness of the photoresist at each of the locations upon which the electron beam is incident, and controlling the amount of charge of the electron beam to maximize the energy of the electron beam absorbed by the coated photoresist and minimize the energy absorbed by structures underlying the substrate during exposure from the incident electron beam so that the coated photoresist is thoroughly exposed and ionizing radiation damage to the underlying substrate from the projected electron beam is minimized.

2. The method of claim 1 wherein the step of coating a substrate with a photoresist comprises applying a bottom planarizing layer to overlay the topographical features of the substrate and applying a top imaging layer to the applied planarizing layer to receive the incident electron beam for generating a photoresist mask.

3. The method of claim 1 wherein the step of controlling the energy of the projected electron beam comprises correlating the energy incident upon the coated photoresist to the dwell time of the projected electron beam in the area upon which it is incident to expose the photoresist with minimal penetration to underlying layers.

* * * * *